US010890850B2

(12) United States Patent
Hembacher et al.

(10) Patent No.: US 10,890,850 B2
(45) Date of Patent: Jan. 12, 2021

(54) OPTICAL IMAGING ARRANGEMENT WITH ACTIVELY ADJUSTABLE METROLOGY SUPPORT UNITS (71) Applicant: Carl Zeiss SMT GmbH, Oberkochen (DE)

(72) Inventors: Stefan Hembacher, Bobingen (DE); Bernhard Geuppert, Aalen (DE); Jens Kugler, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/988,113

(22) Filed: May 24, 2018

(65) Prior Publication Data

US 2018/0275527 A1    Sep. 27, 2018

Related U.S. Application Data (63) Continuation of application No. PCT/EP2015/078548, filed on Dec. 3, 2015.

(51) Int. Cl.
*G03F 7/20* (2006.01)

(52) U.S. Cl.
CPC .......... *G03F 7/70266* (2013.01); *G03F 7/709* (2013.01); *G03F 7/70258* (2013.01);
(Continued)

(58) Field of Classification Search
CPC ............. G03F 7/70266; G03F 7/70258; G03F 7/70308; G03F 7/70825; G03F 7/70883; G03F 7/709
See application file for complete search history.

(56) References Cited

U.S. PATENT DOCUMENTS 10,303,066 B2   5/2019  Mulkens et al.
2002/0149754 A1*  10/2002  Auer ....................... G03F 7/709
                                                          355/53
(Continued)

FOREIGN PATENT DOCUMENTS

EP   1503244 A1   2/2005
EP   2 128 700 A1   12/2009
(Continued)

OTHER PUBLICATIONS

International Search Report and Written Opinion for corresponding Appl No. PCT/EP2015/078548 dated Sep. 20, 2016.
(Continued)

*Primary Examiner* — Deoram Persaud
(74) *Attorney, Agent, or Firm* — Fish & Richardson P.C.

(57) ABSTRACT

An optical imaging arrangement includes an optical projection system, a support structure system and a control device. The optical projection system includes a group of optical elements supported by the support structure system and configured to transfer, in an exposure process using exposure light along an exposure light path, an image of a pattern of a mask onto a substrate. The group of optical elements includes a first optical element and a second optical element and the control device includes a sensor device and an active device. The sensor device is functionally associated to the first optical element and is configured to capture mechanical disturbance information representative of a mechanical disturbance acting on the first optical element in at least one degree of freedom up to all six degrees of freedom.

21 Claims, 2 Drawing Sheets

(52) U.S. Cl.
CPC ...... *G03F 7/70308* (2013.01); *G03F 7/70825* (2013.01); *G03F 7/70883* (2013.01)

(56) References Cited

U.S. PATENT DOCUMENTS

| | | | | |
|---|---|---|---|---|
| 2003/0197914 | A1* | 10/2003 | Cox | G03F 7/70258 355/53 |
| 2004/0227107 | A1* | 11/2004 | Cox | G03F 7/709 250/548 |
| 2005/0063288 | A1 | 3/2005 | Nawata et al. | |
| 2005/0140950 | A1* | 6/2005 | Franken | G03F 7/70825 355/53 |
| 2007/0280609 | A1* | 12/2007 | Ito | G02B 7/023 385/94 |
| 2008/0068568 | A1* | 3/2008 | Ebihara | G03F 7/70833 355/30 |
| 2008/0212083 | A1* | 9/2008 | Kwan | G03F 7/70233 356/124 |
| 2008/0218720 | A1* | 9/2008 | Mayama | G03F 7/70833 355/67 |
| 2011/0165522 | A1 | 7/2011 | Mann et al. | |
| 2011/0299053 | A1* | 12/2011 | Steinbach | G02B 26/06 355/67 |
| 2012/0105819 | A1* | 5/2012 | Butler | G03F 7/70833 355/72 |
| 2013/0242282 | A1 | 9/2013 | Hembacher | |
| 2014/0176927 | A1 | 6/2014 | Kwan | |
| 2016/0179013 | A1* | 6/2016 | Kugler | G02B 7/182 355/67 |
| 2018/0101105 | A1* | 4/2018 | Freimann | G02B 7/1828 |
| 2019/0086823 | A1* | 3/2019 | Schaffer | G03F 7/70825 |

FOREIGN PATENT DOCUMENTS

| | | |
|---|---|---|
| EP | 2128700 A1 | 12/2009 |
| JP | 06-250061 A | 9/1994 |
| JP | 2000-066075 A | 3/2000 |
| JP | 2005-051242 A | 2/2005 |
| JP | 2005-236258 A | 9/2005 |
| JP | 2006-140366 A | 6/2006 |
| JP | 2012-502490 A | 1/2012 |
| JP | 2014-521204 A | 8/2014 |
| KR | 10-2009-0103762 A | 10/2009 |
| WO | WO 2005/006417 | 1/2005 |
| WO | WO 2012/013559 A1 | 2/2012 |
| WO | WO 2013/004403 A1 | 1/2013 |

OTHER PUBLICATIONS

Japanese Office Action, with translation thereof, for corresponding JP Appl No. 2018-528584, dated Oct. 1, 2019.
Examination Report from related Chinese Application No. 201580085002.8, dated Mar. 3, 2020, with English translation.
Japanese Office Action, with translation thereof, for corresponding APpl No. 2018-528584, dated May 26, 2020.

* cited by examiner

OPTICAL IMAGING ARRANGEMENT WITH ACTIVELY ADJUSTABLE METROLOGY SUPPORT UNITS

CROSS-REFERENCE TO RELATED APPLICATION

The present application is a continuation of, and claims benefit under 35 USC 120 to, international application PCT/EP2015/078548, filed Dec. 3, 2015. The entire disclosure of this application is incorporated by reference herein.

FIELD

The disclosure relates to optical imaging arrangements used in exposure processes, in particular to optical imaging arrangements of microlithography systems. It further relates to a method of at least partially correcting an imaging error of such optical imaging arrangements as well as optical imaging methods including such imaging error correction. The disclosure may be used in the context of photolithography processes for fabricating microelectronic devices, in particular semiconductor devices, or in the context of fabricating devices, such as masks or reticles, used during such photolithography processes.

BACKGROUND

Typically, the optical systems used in the context of fabricating microelectronic devices such as semiconductor devices include a plurality of optical element units including optical elements, such as lenses and mirrors etc., arranged in the exposure light path of the optical system. Those optical elements usually cooperate in an exposure process to transfer an image of a pattern formed on a mask, reticle or the like onto a substrate such as a wafer. The optical elements are usually combined in one or more functionally distinct optical element groups. These distinct optical element groups may be held by distinct optical exposure units. In particular with mainly refractive systems, such optical exposure units are often built from a stack of optical element modules holding one or more optical elements. These optical element modules usually include an external generally ring shaped support device supporting one or more optical element holders each, in turn, holding an optical element.

Due to the ongoing miniaturization of semiconductor devices there is, however, a desire for enhanced resolution of the optical systems used for fabricating those semiconductor devices. This desire for enhanced resolution obviously pushes the desire for an increased numerical aperture (NA) and increased imaging accuracy of the optical system.

One approach to achieve enhanced resolution is to reduce the wavelength of the light used in the exposure process. In the recent years, approaches have been taken using light in the extreme ultraviolet (EUV) range, typically using wavelengths ranging from 5 nm to 20 nm, in most cases about 13 nm. In this EUV range it is not possible to use common refractive optics any more. This is due to the fact that, in this EUV range, the materials commonly used for refractive optical elements show a degree of absorption that is too high for obtaining high quality exposure rPesults. Thus, in the EUV range, reflective systems including reflective elements such as mirrors or the like are used in the exposure process to transfer the image of the pattern formed on the mask onto the substrate, e.g. the wafer.

The transition to the use of high numerical aperture (e.g. NA>0.4 to 0.5) reflective systems in the EUV range leads to considerable challenges with respect to the design of the optical imaging arrangement.

One of the desired accuracy characteristics is the accuracy of the position of the image on the substrate, which is also referred to as the line of sight (LoS) accuracy. The line of sight accuracy typically scales to approximately the inverse of the numerical aperture. Hence, the line of sight accuracy is a factor of 1.4 smaller for an optical imaging arrangement with a numerical aperture NA=0.45 than that of an optical imaging arrangement with a numerical aperture of NA=0.33. Typically, the line of sight accuracy ranges below 0.5 nm for a numerical aperture of NA=0.45. If double patterning is also to be allowed for in the exposure process, then the accuracy would typically have to be reduced by a further factor of 1.4. Hence, in this case, the line of sight accuracy would range even below 0.3 nm.

Among others, the above leads to relatively strict desired properties with respect to the relative position between the components participating in the exposure process. Furthermore, to reliably obtain high-quality semiconductor devices it is not only desirable to provide an optical system showing a high degree of imaging accuracy. It is also desirable to maintain such a high degree of accuracy throughout the entire exposure process and over the lifetime of the system. As a consequence, the optical imaging arrangement components, i.e. the mask, the optical elements and the wafer, for example, cooperating in the exposure process is supported in a well defined manner in order to maintain a predetermined spatial relationship between the optical imaging arrangement components as well to provide a high quality exposure process.

To maintain the predetermined spatial relationship between the optical imaging arrangement components throughout the entire exposure process, even under the influence of vibrations introduced, among others, via the ground structure supporting the arrangement and/or via internal sources of vibration disturbances, such as accelerated masses (e.g. moving components, turbulent fluid streams, etc.), as well as the under the influence of thermally induced position alterations, it is desirable to at least intermittently capture the spatial relationship between certain components of the optical imaging arrangement and to adjust the position of at least one of the components of the optical imaging arrangement as a function of the result of this capturing process.

In most conventional systems, this process of capturing the spatial relationship between components cooperating in the exposure process is done via a metrology system using a central support structure for the optical projection system and the substrate system as a common reference in order to be able to readily synchronize motion of the actively adjusted parts of the imaging arrangement.

On the other hand, an increase in the numerical aperture, typically, leads to an increased size of the optical elements used, also referred to as the optical footprint of the optical elements. The increased optical footprint of the optical elements used has a negative impact on their dynamic properties and the control system used to achieve the above adjustments. Furthermore, the increased optical footprint typically leads to larger light ray incidence angles. However, at such increased light ray incidence angles transmissivity of the multi-layer coatings typically used for generating the reflective surface of the optical elements is drastically reduced, obviously leading to an undesired loss in light power and an increased heating of the optical elements due to absorption. As a consequence, even larger optical elements have to be used in order to enable such imaging at a commercially acceptable scale.

These circumstances lead to optical imaging arrangements with comparatively large optical elements having an optical footprint of up to 1 m×1 m and which are arranged very close to each other with mutual distances ranging down to less than 60 mm. Typically, in such a system with high numerical aperture NA involving extremely low distortions, the optical path length reaches more than 2 m, while the object to image shift reaches 50 cm and more. These core figures are involved in determining the overall size of the support structure, such as the optical element support structure for the optical elements as well as the metrology support structure for the metrology system. Typically, the overall dimensions of these support structures roughly reach 2 m×1.2 m×1.5 m. One issue arising from the above situation is that such large structures are generally less rigid. For example, as will become apparent from the following equation for the maximum deformation $\omega_{max}$ of a circular plane parallel plate perpendicular to its planar surfaces:

$$\omega_{max} = \frac{3}{16} \cdot \frac{\rho \cdot g}{E} \cdot \frac{a^4}{h^2} \cdot (1-v) \cdot (5+v) \quad (1)$$

(with: a: radius of the plate, h: central thickness of the plate, v: Poisson number, ρ: density, E: elastic modulus, and, g: acceleration perpendicular to the planar surfaces), increasing the diameter (a) of the plate by a factor of 2 would involve increasing the central thickness (h) by a factor of 4 to keep the maximum deformation $\omega_{max}$ stable (i.e. compensate for the loss in rigidity). Apparently, the mass of such a plate is proportional to its thickness, which aggravates the dynamic issues.

Such less rigid structures not only contribute to further restrictions of adjustment control performance, but also to residual errors due to quasi-static deformations of the respective structure caused by residual low frequency vibration disturbances. Such residual low frequency vibration disturbances may still be present despite the fact that the respective support structure provides support in a vibration isolated manner. Hence, the negative effects of such low frequency vibration disturbances become even more prominent. Moreover, building space restrictions as mentioned above as well as restrictions of the optical system do not allow simple integration of such large components.

An approach to tackle such issues is generally known from WO 2012/013559 A1 (Hembacher), the entire disclosure of which is incorporated herein by reference. According to this document, acceleration acting on an optical element is measured at the optical element and the measured acceleration is used to control an active deformation device of the optical element to counteract the deformation of the optical element resulting from the acceleration.

This solution, however, has the disadvantage that additional building space is involved for the active deformation device, which, typically is not available in the area of such large and heavy optical elements particularly affected by such disturbances. Furthermore, such large and heavy optical elements exhibit high inertia, such that sufficiently rapid reaction to such disturbances may not be easily achieved or only achieved by sufficiently powerful actuators, again leading to increased thermal issues as well as aggravated building space issues.

SUMMARY

The disclosure seeks to, at least to some extent, address the above disadvantages and to provide good and long term reliable imaging properties of an optical imaging arrangement used in an exposure process.

The disclosure also seeks to reduce the effort for an optical imaging arrangement while at least maintaining the imaging accuracy of the optical imaging arrangement used in an exposure process.

The disclosure further seeks to reduce the negative influence on imaging quality of residual low-frequency vibration disturbances introduced into the optical system of an optical imaging arrangement.

According to one aspect, the disclosure is based on the technical teaching that an overall reduction of the effort for an optical imaging arrangement while at least maintaining the imaging accuracy of the optical imaging arrangement, in particular, even under the presence of low-frequency vibration disturbances may be achieved if mechanical disturbance introduced into a (typically important) first optical element of the projection system is measured and the disturbance information obtained is used to control an imaging error correcting action on a different, second optical element of the projection system.

Acting on a second optical element different from the first optical element has the advantage (at least partial) correction may be achieved at a location, which is more readily accessible and/or subject to less building space restrictions than a typically heavy and/or large (and hence dynamically more important) first optical element. Moreover, the second optical element may be a smaller and/or lighter element, which causes fewer issues in achieving proper and sufficiently rapid actuation.

It should be noted that the mechanical disturbance, typically, will be determined in all degrees of freedom (DOF) in space, which are relevant for the imaging quality in the specific imaging process performed (i.e. in at least one or more degrees of freedom, typically in all six degrees of freedom). Actuation of the second optical element will then typically have to be carried out as a function of the captured disturbance to achieve suitable correction or compensation in all these relevant degrees of freedom.

Moreover, under a further aspect, the overall support for the first optical element is facilitated, since, overall, less expense has to be made to avoid the introduction of mechanical disturbances (such as vibration) or the like into the first optical element.

It will be appreciated that control of the actuation of the second optical element may also be carried out in a proactive manner. The captured disturbance can then, for example, be used to generate a forecast of the reaction of the first optical element resulting from this disturbance. The forecast can then be used to initiate appropriate counteractions to the disturbance at the second optical element.

Such a proactive control of the second optical element may be realized using suitable numerically and/or empirically generated models of the relevant parts and/or the optical properties of the optical imaging arrangement. It will be appreciated that such a model may immediately yield suitable control parameters for the control of the second optical element in response to an input of the respective information relating to the captured disturbance. It will be further appreciated that the disturbance may be of any type, which influences the state of the respective metrology support substructure and can be at least partially counteracted by an appropriate action on the second optical element.

Typically, such disturbances are vibrational disturbances. However, other disturbances such as, for example, thermal disturbances may also be of relevance in this respect.

Thus, according to a first aspect of the disclosure there is provided an optical imaging arrangement including an optical projection system, a support structure system, and a control device. The optical projection system includes a group of optical elements supported by the support structure system and configured to transfer, in an exposure process using exposure light along an exposure light path, an image of a pattern of a mask onto a substrate. The group of optical elements includes a first optical element and a second optical element and the control device includes a sensor device and an active device. The sensor device is functionally associated to the first optical element and is configured to capture mechanical disturbance information representative of a mechanical disturbance acting on the first optical element in at least one degree of freedom up to all six degrees of freedom. The control device is configured to control the active device as a function of the mechanical disturbance information, such that the active device acts on one of the optical elements to at least partially correct an optical imaging error of the optical imaging arrangement during the exposure process resulting from the mechanical disturbance acting on the first optical element. The active device at least acts on the second optical element to at least partially correct the optical imaging error.

It will be appreciated that it may be sufficient to act on one single second optical element to at least partially (preferably substantially completely) correct the optical imaging error resulting from the mechanical disturbance. With certain embodiments, however, it may be provided that the active device acts on more than one second optical element to achieve correction.

Furthermore, with certain embodiments, it may be provided that more than one first optical element is part of the correction system, and at least partial correction of the imaging error of these first optical elements is provided by the active device. Here, similarly, the active device may act on one or more second optical elements to (at least partially) correct the respective imaging error resulting from the respective mechanical disturbance acting on the respective first optical element. In particular, again, one single second optical element may be acted on to achieve (at least partial) correction of the respective imaging error. In some cases, control of the active device may then take place via a simple overlay of the control signals determined from the respective captured disturbance acting the respective first optical element.

It will be appreciated that the active device may be designed in any desired and suitable way to act on the assigned first optical element. For example, to at least partially correct the imaging error resulting from the mechanical disturbance acting on the first optical element, it may be sufficient to impose certain rigid body movements onto the second optical element. With certain embodiments, however, it may also be desired, in addition or as an alternative, to generate a certain deformation of the optical surface of the second optical element to achieve proper correction of the imaging error. While the desired rigid body motions of the second optical element, apparently, have to be generated via the support structure system, desired deformation of the optical surface of the second optical element may either be generated by the support structure system or by a deformation device acting internal to the optical module including the second optical element.

Hence, with certain embodiments involving the support structure system in the active correction, the active device includes an active support unit of the support structure system, the active support unit supporting the second optical element and being configured to adjust a position and/or an orientation and/or a deformation of the second optical element in at least one degree of freedom (up to all six degrees of freedom in space).

In addition or as alternative, in particular with further embodiments involving an active device internal to the optical module including the second optical element, the internal deformation the active device includes an active deformation device assigned to the second optical element and configured to adjust a deformation of the second optical element in at least one degree of freedom.

As outlined above, any desired and relevant mechanical disturbance having an influence on the geometric status (i.e. the position and/or orientation and/or deformation) of the first optical element may be captured as the mechanical disturbance at an appropriate location an using appropriate mechanism to capture the disturbance of interest.

To this end, preferably, the sensor device includes at least one sensor unit, which is preferably configured to capture suitable signals allowing assessment of the mechanical disturbance of interest at an appropriate location. It will be appreciated that the appropriate sensor location may vary as a function of the mechanical disturbance of interest to be captured as well as the transmission function for the mechanical disturbance between the sensor location and the first optical element. Provided that this transmission function is sufficiently well known along the disturbance path (i.e. the path the mechanical disturbance takes from the sensor location to the first optical element), even longer distances (along the disturbance path) between the sensor location and the first optical element may be acceptable.

With certain embodiments, the at least one sensor unit is mechanically connected to an optical element unit including the first optical element. Moreover, with certain embodiments, the at least one sensor unit is mechanically connected to the first optical element itself. Such solutions allow particularly precise and simple determination of the mechanical disturbance arriving at and acting on the first optical element.

With certain embodiments, the at least one sensor unit is mechanically connected to an optical imaging arrangement component, in particular to a support structure component of the support structure system, at a sensor location, the sensor location, in particular, being located in a vicinity of the first optical element. As outlined above, here as well, precise and simple determination of the mechanical disturbance arriving at and acting on the first optical element may be achieved.

As mentioned, any desired and relevant mechanical disturbance having an influence on the geometric status (i.e. the position and/or orientation and/or deformation) of the first optical element may be captured as the mechanical disturbance. With certain embodiments, particularly simple and precise assessment of the mechanical disturbance may be achieved if the at least one sensor unit is configured to capture acceleration information in at least one degree of freedom up to all six degrees of freedom as the mechanical disturbance information. Moreover, such solutions relying on acceleration measurements have the advantage that they do not involve (typically complicated and costly) capturing of any optical wavefront aberrations as a result of the mechanical disturbance. Hence, among others, the correction of the optical imaging error may take place during and in parallel to the actual exposure process (i.e. the actual transfer of the image onto the substrate).

Efficiency of the correction system, among others, depends on the reaction speed of the correction control system (i.e. the reaction time from capturing the mechanical disturbance to achieving appropriate action on the second optical element) as well as the runtime of the mechanical disturbance towards the first optical element and the sensitivity of the first optical element to the mechanical disturbance. With certain embodiments, the location where the mechanical disturbance is captured is selected as a function of these parameters to achieve appropriate and timely correction.

More precisely, in some of these cases, a disturbance path exists, along which the mechanical disturbance propagates fastest towards the first optical element. The sensor location is on the disturbance path and the mechanical disturbance, along the disturbance path, has a disturbance runtime from the sensor location to the first optical element. The control device has a control reaction time from capturing the mechanical disturbance information to acting on at least the second optical element to at least partially correct the imaging error. The sensor location is located, along the disturbance path, at a sensor location distance from the optical element; and the sensor location distance is selected such that the control reaction time is smaller than or equal to the disturbance runtime.

It will be appreciated that control of the correction may basically be provided in any desired and suitable way providing timely and proper correction of the imaging error resulting from the mechanical disturbance. With certain embodiments, the control device includes a memory storing control information, wherein the control information is representative of at least one control signal to be provided to the active device as a function of the mechanical disturbance information to at least partially correct the optical imaging error resulting from the mechanical disturbance. A control unit of the control device, to at least partially correct the optical imaging error, is configured to generate at least one correcting control signal using the mechanical disturbance information and the control information and to forward the correcting control signal to the active device.

It will be appreciated that the control information may have been obtained in any suitable way. More precisely, for example, it may have been previously obtained using appropriate simulation of the relevant parts of the optical imaging arrangement. In addition or as an alternative, the control information may have been previously obtained using empirical methods (e.g. from testing the relevant parts of the optical imaging arrangement itself or of a comparable optical imaging arrangement).

With certain embodiments relying on simulation results, the control information may include a previously established mechanical numerical model and a previously established optical model. The mechanical numerical model is a numerical model of a modeled part of the optical imaging arrangement. The modeled part includes at least the first optical element, a capturing location at which the mechanical disturbance information is captured, and a disturbance path along which the mechanical disturbance propagates from the capturing location to the first optical element. The mechanical numerical model is representative of a geometric alteration in a position and/or an orientation and/or a geometry of the first optical element in response to the mechanical disturbance prevailing at the capturing location. The optical model is representative of an imaging error alteration of the imaging error as a function of the geometric alteration. The control device is configured to generate the correcting control signal as a function of the imaging error alteration. To this end, the control device may, in particular, use previously established correcting control signal information stored in the memory. The correcting control signal information is representative of the correcting control signal as a function of the imaging error alteration.

It will be appreciated that the control device may use a combined model including a suitable numerical combination of the mechanical numerical model, the optical model and, eventually also, the correcting control signal information, such that, eventually, the combined model information immediately yields the correcting control signal as a function of the mechanical disturbance information.

With certain, fairly simple embodiments, the control device, to generate the correcting control signal, may be configured to predict an actual geometric alteration of the first optical element in response to an actual mechanical disturbance captured at the capturing location using the mechanical numerical model. Furthermore, the control device may then be configured to predict an actual imaging error alteration of the imaging error as a function of the predicted actual geometric alteration using the optical model. Finally, the control device may be configured to generate an actual correcting control signal as a function of the predicted actual imaging error alteration using the correcting control signal information.

It will be appreciated that the control information may have been established in any desirable suitable way including simulation and/or empirical components. For example, the control information may have been established using a simulation component in the form of numerical model of a modeled part of the optical imaging arrangement, the modeled part including at least the first optical element, a capturing location at which the mechanical disturbance information is captured, and a disturbance path along which the mechanical disturbance propagates from the capturing location to the first optical element, the mechanical numerical model being representative of a geometric alteration in a position and/or an orientation and/or a geometry of the first optical element in response to the mechanical disturbance at the capturing location.

In addition or as alternative, the control information may have been established using a simulation component in the form of an optical model representative of an imaging error alteration of the imaging error as a function of a geometric alteration of the first optical element in response to the mechanical disturbance.

In addition or as alternative, the control information may have been established using an empirical component in the form of an imaging error alteration information representative of an alteration of the imaging error in response to a defined mechanical excitation of the first optical element, the defined mechanical excitation having been generated using at least one actuator device of the support structure system.

The mechanical excitation may have been generated in a suitable way. For example, an actuator device supporting the first optical element and/or an actuator device supporting part of the support structure system may have been used to generate the mechanical excitation. Moreover, the defined mechanical excitation may be of any desired and suitable type. For example, the defined mechanical excitation may be a sinusoidal excitation.

It will be appreciated that, typically, for large and/or heavy first optical elements, residual deformation resulting from low-frequency vibration plays an increasingly important role. Hence, typically, the vibration behavior of the first optical element under such low frequency mechanical excitation is of particular interest. Hence, preferably, in addition or as alternative, the applied defined mechanical excitation may have excitation frequency of 0.05 Hz to 1000 Hz, preferably 0.05 Hz to 100 Hz, more preferably 1 Hz to 30 Hz, even more preferably 1 Hz to 5 Hz; With certain preferred embodiments, the first optical element has a first order bending resonant frequency and the excitation frequency ranges from 0.05 Hz to two thirds of the first order bending resonant frequency.

It will be further appreciated that the control information may have been established in any suitable and desired way. In particular, where appropriate, the control information may have been determined as a direct function of the mechanical disturbance captured. In such cases, particularly simple and rapid reaction to the mechanical disturbance is possible. With certain embodiments, the control information is established in a more generally applicable way related to specific imaging error alterations that are to be counteracted (i.e. irrespective of the specific mechanical disturbance at specific locations). In these cases, the control information may have been established using correcting control signal information representative of the correcting control signal as a function of an imaging error alteration.

It will be appreciated that the present disclosure may be used in the context of any desired optical imaging arrangement having any desired support structure system layout. Since, as mentioned, with increasing weight and/or size of the first optical element, low-frequency vibration may cause increasingly relevant issues regarding imaging accuracy in such optical imaging arrangements. This, in particular, may be the case despite (single- or multi-stage) vibration isolation of the optical elements. Hence, the present disclosure may be particularly beneficially be used in support structure system layouts involving such vibration isolation.

Thus, with preferred embodiments, the support structure system includes a base support structure and an intermediate support structure, wherein the first optical element is supported on the intermediate support structure; and the intermediate support structure is supported on the base structure via a vibration isolation device. Preferably, the vibration isolation device has a vibration isolation resonant frequency in a range from 10 Hz to 1 Hz, preferably from 3 Hz to 0.5 Hz, more preferably from 1 Hz to 0.1 Hz;

It will be further appreciated that the disclosure may be used in the context of any desired optical imaging process at any desired exposure light wavelength. Particularly beneficial results are achieved in the context of microlithography. Hence, with certain embodiments, the optical imaging arrangement is configured to be used in microlithography using exposure light at an exposure light wavelength in a UV range, in particular, an EUV range. Preferably, the exposure light has an exposure light wavelength ranging from 5 nm to 20 nm. Furthermore, the optical elements of the group of optical elements preferably are reflective optical elements.

As outlined above, particularly beneficial results are achieved in the context of large and/or heavy optical elements. Hence, preferably, the first optical element is the largest and/or heaviest among the optical elements of the group of optical elements.

Preferably, to be able to perform an exposure process, the optical imaging arrangement further includes an illumination unit, a mask unit and a substrate unit. The illumination unit is configured to illuminate the mask received within the mask unit with the exposure light and the substrate unit is configured to receive the substrate to receive the image transferred by the optical projection system.

According to a second aspect of the disclosure there is provided a method of at least partially correcting an imaging error of an optical imaging arrangement in an exposure process, the optical imaging arrangement including an optical projection system, a support structure system, and a control device, wherein the optical projection system includes a group of optical elements including a first optical element and a second optical element supported by the support structure system and transferring, in the exposure process using exposure light along an exposure light path, an image of a pattern of a mask onto a substrate. The method includes functionally associating a sensor device to the first optical element and capturing mechanical disturbance information representative of a mechanical disturbance acting on the first optical element in at least one degree of freedom up to all six degrees of freedom. The method further includes controlling an active device as a function of the mechanical disturbance information, such that the active device acts on one of the optical elements to at least partially correct the optical imaging error resulting from the mechanical disturbance acting on the first optical element.

Herein, the active device at least acts on the second optical element to at least partially correct the optical imaging error.

With this method, the aspects, variants and advantages as outlined above in the context of the optical imaging arrangement according to the present disclosure may be achieved to the same extent, such that insofar explicit reference is made to the statements made in the foregoing.

Furthermore, according to a third aspect of the disclosure there is provided an optical imaging method including transferring, in an exposure process using exposure light in an optical imaging arrangement, an image of a pattern onto a substrate, wherein during the exposure process, an imaging error of the optical imaging arrangement is at least partially corrected using a method according to the disclosure.

With this method as well, the aspects, variants and advantages as outlined above in the context of the optical imaging arrangement according to the present disclosure may be achieved to the same extent, such that insofar explicit reference is made to the statements made in the foregoing.

Further aspects and embodiments of the disclosure will become apparent from the dependent claims and the following description of preferred embodiments which refers to the appended figures. All combinations of the features disclosed, whether explicitly recited in the claims or not, are within the scope of the disclosure.

DETAILED DESCRIPTION OF THE DISCLOSURE

In the following, preferred embodiments of an optical imaging arrangement 101 according to the disclosure using which preferred embodiments of methods according to the disclosure may be executed will be described with reference to FIGS. 1 to 3. To facilitate understanding of the following explanations an xyz coordinate system is introduced in some of the Figures, wherein the z-direction designates the vertical direction (i.e. the direction of gravity). It will be appreciated however that any other spatial orientation of the components of the optical imaging arrangement 101 may be chosen.

Figure 1:
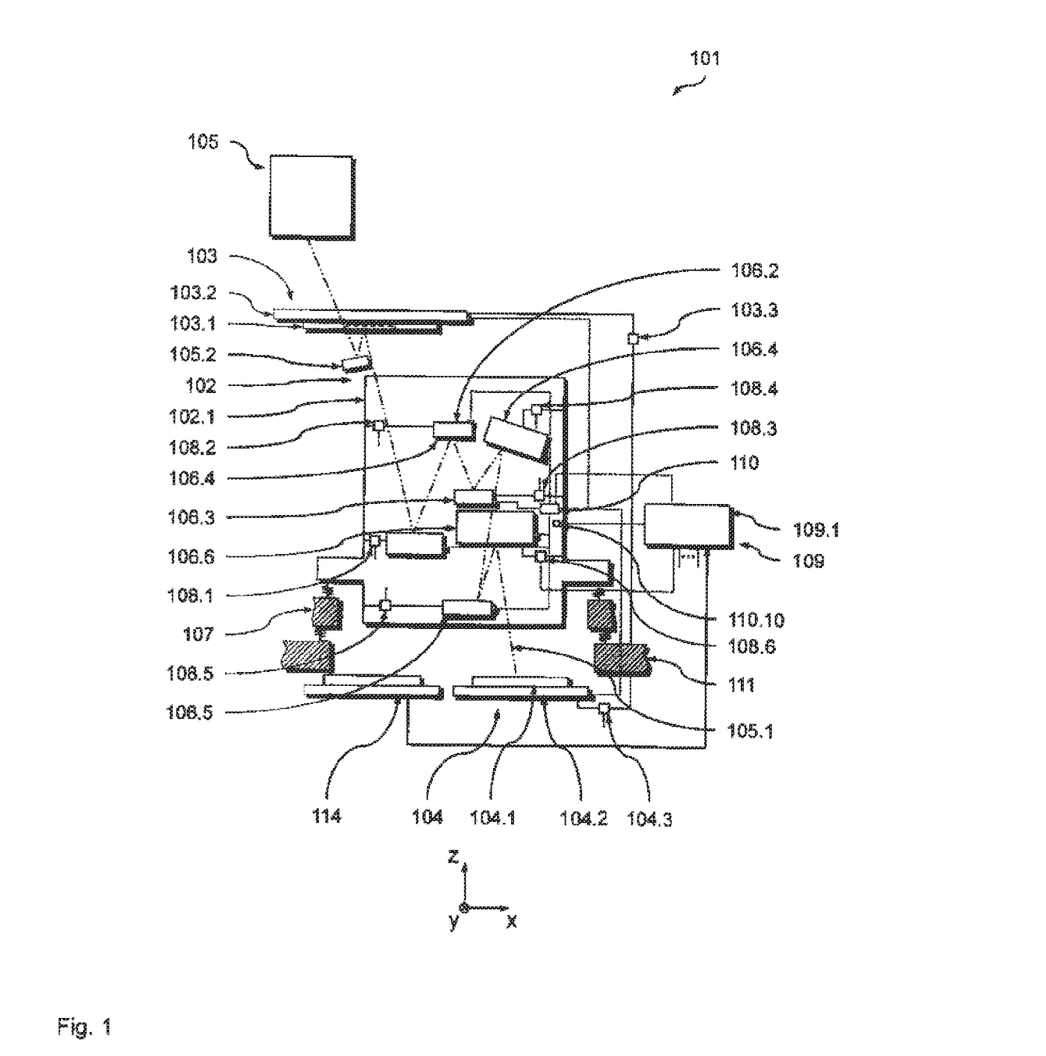
FIG. 1 is a schematic representation of a preferred embodiment of an optical imaging arrangement according to the disclosure with which preferred embodiments of methods according to the disclosure may be executed.

FIG. 1 is a highly schematic and not-to-scale representation of the optical imaging arrangement in the form of an optical exposure apparatus 101 operating in the EUV range at a wavelength of 13 nm. The optical exposure apparatus 101 includes an optical projection unit 102 adapted to transfer an image of a pattern formed on a mask 103.1 (located on a mask table 103.2 of a mask unit 103) onto a substrate 104.1 (located on a substrate table 104.2 of a substrate unit 104). To this end, the optical exposure apparatus 101 includes an illumination system 105 illuminating the reflective mask 103.1 with exposure light (represented by its chief ray 105.1) via an appropriate light guide system 105.2. The optical projection unit 102 receives the light reflected from the mask 103.1 and projects the image of the pattern formed on the mask 103.1 onto the substrate 104.1, e.g. a wafer or the like, along an exposure light path.

To this end, the optical projection unit 102 holds an optical element unit group 106 of optical element units 106.1 to 106.6. This optical element unit group 106 is held within an optical element support structure 102.1 forming part of the support structure system. The optical element support structure 102.1 may take the form of a housing structure of the optical projection unit 102, which, in the following, is also referred to as the projection optics box structure (POB) 102.1. It will be appreciated, however, that this optical element support structure does not necessarily have to form a complete or even (light and/or fluid) tight enclosure of the optical element unit group 106. Rather it may also be partially formed as an open structure as it is the case with the present example. It will be appreciated that, in the sense of the present disclosure, an optical element unit may merely consist of an optical element, such as a mirror. However, such an optical element unit may also include further components such as a holder holding such an optical element.

Each one of the mirrors 106.1 (M1) to 106.6 (M6) is supported on the projection optics box structure 102.1 by an associated support device 108.1 to 108.6. Each one of the support devices 108.1 to 108.6 may be formed as an active device such that each of the mirrors 106.1 to 106.6 may be actively supported under the control of a control unit 109.1 of a control device 109 at a defined control bandwidth as a function of status information captured via a sensor device 110 of the control device 109.

The projection optics box structure 102.1 is supported in a vibration isolated manner on a load bearing structure 107. The load bearing structure 107, in turn, is supported on a ground or base structure 111. The projection optics box structure 102.1 and the load bearing structure 107 together form an intermediate support structure 112. Both, the load bearing structure 107 and the base structure 111 also form part of the support structure system.

The load bearing structure 107 is supported on the ground or base structure 111 in a vibration isolated manner at a vibration isolation resonant frequency that ranges from 0.05 Hz to 8.0 Hz, preferably from 0.1 Hz to 1.0 Hz, more preferably from 0.2 Hz to 0.6 Hz. Furthermore, typically, a damping ratio is selected that ranges from 5% to 60%, preferably from 10% to 30%, more preferably from 20% to 25%. In the present example a vibration isolation resonant frequency of 0.25 Hz to 2 Hz at a damping ratio of 15% to 35% is selected for the vibration isolated support of the load bearing structure 107.

The ground or base structure 111 (in a vibration isolated manner) also supports the mask table 103.2 via a mask table support device 103.3 and the substrate table 104.2 via a substrate table support device 104.3. It will be appreciated however that, with other embodiments of the disclosure, the load bearing structure 107 may also support (preferably in a vibration isolated manner) the mask table 103.2 and/or the substrate table 104.2.

It will be appreciated that the projection optics box structure 102.1 may be supported in a cascaded manner via a plurality of vibration isolation devices and at least one intermediate support structure unit to achieve good vibration isolation. Generally, these vibration isolation devices may have different isolation frequencies to achieve good vibration isolation over a wide frequency range.

The optical element unit group 106 includes a total of six optical element units, namely an optical element unit 106.1, an optical element unit 106.2, an optical element unit 106.3, an optical element unit 106.4, an optical element unit 106.5 and an optical element unit 106.6. In the present embodiment, each of the optical element units 106.1 to 106.6 consists of an optical element in the form of a mirror, also referred to as mirrors M1 to M6 in the following.

It will be appreciated however that, with other embodiments of the disclosure, (as mentioned above) the respective optical element unit may also include further components (beyond the optical element itself) such as, for example, aperture stops, holders or retainers holding the optical element and eventually forming an interface for the support unit connecting the optical element unit to the support structure.

It will be further appreciated that, with other embodiments of the disclosure, another number of optical element units may be used. Preferably, four to eight optical element units are provided.

The image of the pattern formed on the mask 103.1 is usually reduced in size and transferred to several target areas of the substrate 104.1. The image of the pattern formed on the mask 103.1 may be transferred to the respective target area on the substrate 104.1 in two different ways depending on the design of the optical exposure apparatus 101. If the optical exposure apparatus 101 is designed as a so called wafer stepper apparatus, the entire image of the pattern is transferred to the respective target area on the substrate 104.1 in one single step by irradiating the entire pattern formed on the mask 103.1. If the optical exposure apparatus 101 is designed as a so called step-and-scan apparatus, the image of the pattern is transferred to the respective target area on the substrate 104.1 by progressively scanning the mask table 103.2 and thus the pattern formed on the mask 103.1 under the projection beam while performing a corresponding scanning movement of the substrate table 104.2 and, thus, of the substrate 104.1 at the same time.

In both cases, a given spatial relationship between the components participating in the exposure process (i.e. between the optical elements of the optical element unit group 106, i.e. the mirrors 106.1 to 106.6, with respect to each other as well as with respect to the mask 103.1 and with respect to the substrate 104.1 has to be maintained within predetermined limits to obtain a high quality optical imaging result with a low optical imaging error IE.

In the present example, the mirror 106.6 (M6) of the optical element unit 106.6 is a large and heavy component forming a first optical element of the optical element unit group 106 while at least one of the other optical element units 106.1 to 106.5 forms a second optical element of the optical element unit group 106. In the present example, the mirror 106.2 (M2) forms such a second optical element. With certain embodiments, the optical element 106.6 may, in particular, be the largest and/or heaviest optical element of the optical imaging apparatus 101.

The first optical element unit 106.6 and the first optical element 106.6, respectively, may be actively supported at a low first control bandwidth, while the other optical element units 106.1 to 106.5, including the second optical element 106.2, are actively supported at a second control bandwidth to substantially maintain a given spatial relationship of each of the second optical element units 106.1 to 106.5 with respect to the first optical element unit 106.6 as it is disclosed in WO 2013/004403 A1 (the entire disclosure of which is incorporated herein by reference).

In the present example, a similar active support concept is chosen for the mask table support device 103.3 and the substrate table support device 104.3 both also actively supported at a third and fourth control bandwidth, respectively, to substantially maintain a given spatial relationship of the mask table 103.2 and the substrate table 104.2, respectively, with respect to the first optical element unit 106.6. It will be appreciated however that, with other embodiments of the disclosure, another support concept may be chosen for the mask table and/or the substrate table.

As had been outlined above, as is the case with the first optical element 106.6, a large and heavy optical element not only aggravates restrictions of adjustment control performance. Such a large and heavy optical element 106.6, due to its reduced rigidity (compared to smaller and lighter optical elements) is also prone to invoke optical imaging errors IEMD in the optical imaging process, which are due to residual quasi-static deformations caused by residual low frequency vibration disturbances. Such mechanical disturbance in the form of residual low frequency vibration disturbances may still be present despite the fact that the respective support structure 102.1, 107, 111 provides support in a vibration isolated manner. Hence, the negative effects of such low frequency vibration disturbances become even more prominent, the heavier and/or larger the first optical element 106.6 has to be (for optical performance reasons).

A straightforward approach to reduce such residual quasi-static deformation due to low-frequency vibration would be to try to increase the rigidity of the optical element 106.6. As mentioned, this would typically involve increasing the size and weight of the optical element 106.6, which is undesired in terms of its dynamic properties as well as building space restrictions within the optical projection unit 102.

Contrary to that, the present disclosure tackles these issues by obtaining mechanical disturbance information MDI representative of mechanical disturbance MD introduced into the first optical element 106.6 and using the disturbance information MDI obtained to control an imaging error correcting action IECA on the second optical element 106.2, which at least partially corrects the optical imaging error IEMD resulting from the mechanical disturbance MD acting on the first optical element 106.6.

Acting on the second optical element 106.2 (which is different from the first optical element 106.6) has the advantage that (at least partial) correction of the optical imaging error IEMD resulting from the response of the first optical element 106.6 to the mechanical disturbance MD may be achieved at the location of the second optical element 106.2, which is more readily accessible and subject to less building space restrictions than the heavy and large (and hence dynamically more important) first optical element 106.6. Moreover, the second optical element 106.2 is a smaller and lighter element with better dynamic properties (than the first optical element 106.6), which causes fewer issues in achieving proper and sufficiently rapid actuation and imaging error correction, respectively.

It will be further appreciated that such an approach using active imaging error correction at the second optical element 106.2 also relaxes the constraints for the support of the first optical element 106.6. This is due to the fact that, overall, less expense has to be made to avoid the introduction of mechanical disturbances MD (such as vibration) or the like into the first optical element 106.6.

To obtain the mechanical disturbance information MDI, the sensor device 110 includes a sensor unit 110.1. The sensor unit 110.1 is functionally associated to the first optical element 106.6 (M6) and configured to capture the mechanical disturbance information MDI, which is representative of the mechanical disturbance MD acting on the first optical element 106.6 in at least one degree of freedom up to all six degrees of freedom.

It should be noted that the mechanical disturbance MD, typically, will be determined in all degrees of freedom (DOF) in space, which are relevant for the imaging quality in the specific imaging process performed by the optical imaging apparatus 101 (i.e. in at least one or more degrees of freedom, typically in all six degrees of freedom). Actuation of the second optical element 106.2 will then typically have to be carried out as a function of the captured mechanical disturbance information MDI to achieve suitable correction or compensation of the optical imaging error IEMD resulting from the mechanical disturbance MD in all these relevant degrees of freedom.

To achieve appropriate actuation of the second optical element 106.2, the active support device 108.2 of the second optical element 106.2 forms part of an active device 113 of the control device 109. It will be appreciated that it may be sufficient to exclusively act on the second optical element 106.2 to at least partially (preferably substantially completely) correct the optical imaging error IEMD resulting from the mechanical disturbance MD acting on the first optical element 106.6.

With certain embodiments, however, it may be provided that the active device 113 includes one or more further active support devices of the optical element units (e.g. the active support device 108.1 of the optical element unit 106.1). In this case it may be provided that the active device 113 on more than one second optical element unit (e.g. optical element units 106.1 and 106.2) to achieve appropriate correction.

Furthermore, with certain embodiments, it may be provided that, in addition to the first optical element 106.6, a further optical element (e.g. optical element 106.4) forms a further first optical element being part of the correction system. Here, at least partial correction of the imaging error IEMD resulting from the impact of the mechanical disturbance MD on these first optical elements (e.g. 106.6, 106.4) is provided by the active device 113.

Here, similarly, the active device 113 may act on one or more second optical elements (e.g. 106.2, 106.1) to at least partially correct the respective imaging error IEMD resulting from the respective mechanical disturbance MD acting on the respective first optical element (e.g. 106.6, 106.4). In particular, again, one single second optical element (e.g. 106.2) may be acted on to achieve corresponding correction of the respective imaging error IEMD. In some cases, control of the active device 113 may then take place via a simple overlay of the correction control signals CCS determined from the respective captured disturbance MD acting the respective first optical element (e.g. 106.6, 106.4).

In the present example, to at least partially correct the imaging error resulting from the mechanical disturbance MD acting on the first optical element 106.6, it may be sufficient to impose certain rigid body movements RBM onto the second optical element 106.2. With certain embodiments, however, it may also be desired, to generate a certain deformation OSD of the optical surface of the second optical element 106.2 to achieve proper correction of the imaging error IEMD.

In the present example, the support structure system is involved in the active correction of the imaging error IEMD via its active support unit 108.2. To this end, the active support device 108.2 of the active device 113 is configured to generate the desired rigid body motions RBM (i.e. to adjust a position and/or an orientation) of the second optical element 106.2 as well as to generate the desired deformation OSD (i.e. to adjust a deformation) of the optical surface of the second optical element 106.2 in at least one degree of freedom (up to all six degrees of freedom in space).

With further embodiments, in addition or as alternative, a deformation device (as indicated by the dashed contour 114 in FIG. 2) acting internal to the optical module including the second optical element 106.2 may be provided. It will be appreciated that it may even be sufficient to exclusively provide such an internal deformation device 114 assigned to the second optical element 106.2. This applies in cases where correction of the optical imaging error IEMD is provided exclusively via appropriate deformation OSD introduced into the optical surface of the second optical element 106.2 in at least one degree of freedom (up to all six degrees of freedom in space).

As outlined above, any desired and relevant mechanical disturbance having an influence on the geometric status (i.e. the position and/or orientation and/or deformation) of the first optical element 106.2 may be captured as the mechanical disturbance MD at an appropriate location SL using an appropriate mechanism to capture the disturbance of interest.

In the present example, the sensor unit 110.1 of the sensor device 110 is configured to capture suitable signals allowing assessment of the mechanical disturbance MD of interest at an appropriate location SL1. It will be appreciated that the appropriate sensor location SL1 may vary as a function of the mechanical disturbance MD of interest to be captured as well as the transmission function TF for the mechanical disturbance MD between the sensor location SL1 and the first optical element 106.6 (M6). Provided that this transmission function TF is sufficiently well known along the disturbance path (i.e. the path the mechanical disturbance MD takes from the sensor location SL1 to the relevant part of the first optical element 106.6, typically to the optical surface of the first optical element 106.6), even longer distances D (along the disturbance path) between the sensor location SL1 and the first optical element 106.6 may be acceptable.

In the present example, the sensor unit 110.1 is mechanically connected to the optical element unit formed by the first optical element 106.6 itself. Such solutions allow particularly precise and simple determination of the mechanical disturbance MD arriving at and acting on the first optical element 106.6.

As mentioned, any desired and relevant mechanical disturbance MD having an influence on the geometric status (i.e. the position and/or orientation and/or deformation) of the first optical element 106.6 may be captured as the mechanical disturbance MD. In the present example, particularly simple and precise assessment of the mechanical disturbance MD is achieved in that the sensor unit 110.1 is configured to capture acceleration information AI in at least one degree of freedom up to all six degrees of freedom as the mechanical disturbance information MDI.

As explained, such a solution relying on acceleration measurements has the advantage that it doesn't involve (typically complicated and costly) capturing of any optical wavefront aberrations of the exposure light EL along its path as a result of the mechanical disturbance MD. Hence, among others, the correction of the optical imaging error IEMD may take place during and in parallel to the actual exposure process (i.e. the actual transfer of the image from the mask 103.1 onto the substrate 104.1).

Efficiency of the present imaging error correction system, among others, depends on the reaction speed RS of the correction control system (i.e. the reaction time from capturing the mechanical disturbance MD to achieving appropriate action on the second optical element 106.2) as well as the runtime DRT of the mechanical disturbance MD from the sensor location SL towards the first optical element 106.6 and the sensitivity of the first optical element 106.6 to the mechanical disturbance MD. With certain embodiments, the location where the mechanical disturbance is captured (i.e. the sensor location SL) is selected as a function of these parameters to achieve appropriate and timely correction. More precisely, in the present example, it may be provided that (in addition or as an alternative to sensor unit 110.1) a sensor unit 110.2 is provided at a sensor location SL2. Along a disturbance path DP, along which the mechanical disturbance MD propagates fastest from the sensor location SL2 towards the first optical element 106.6, the sensor location SL2 is located at a defined sensor location distance SLD from the first optical element 106.6. The mechanical disturbance MD, along the disturbance path DP, has a disturbance runtime DRT from the sensor location SL2 to the first optical element 106.6. The control device 109, in turn, has a control reaction time CRT from capturing the mechanical disturbance information at the sensor unit 110.2 to acting on the second optical element 106.2 to correct the imaging error IEMD. In order to achieve that the control device 109 timely generates appropriately correcting action at the second optical element 106.2, the sensor location distance SLD from the optical element is selected such that the control reaction time CRT is smaller than or equal to the disturbance runtime DRT, i.e.:

$$CRT \leq DRT \qquad (2)$$

In other words, correcting action can be effected at least within the time it takes the mechanical disturbance MD to arrive and take its effect at the first optical elements 106.6.

Figure 2:
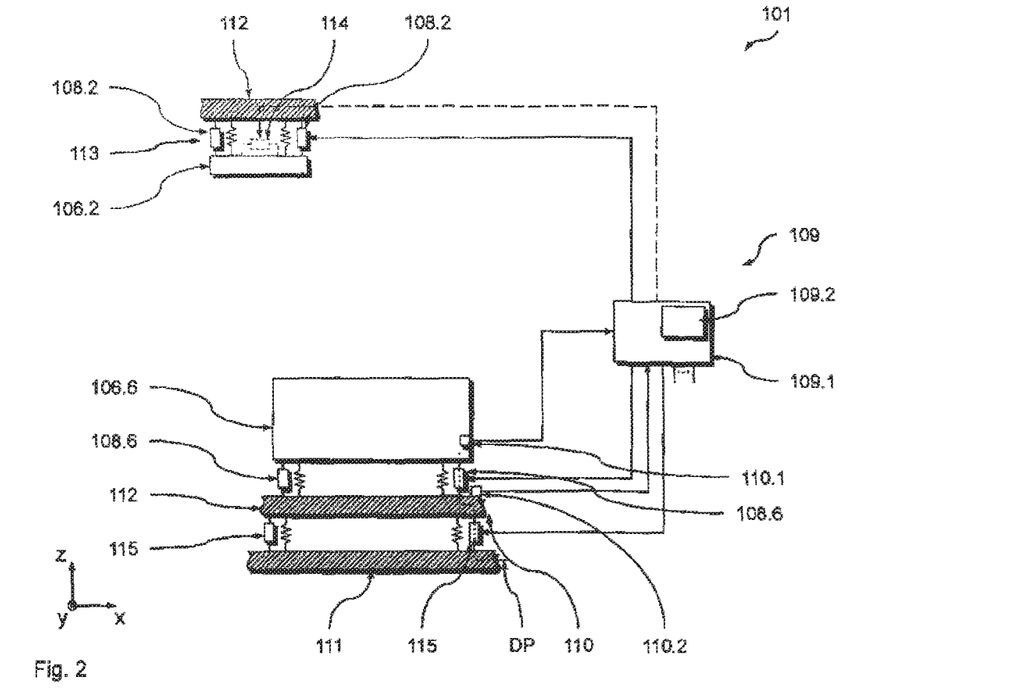
FIG. 2 is a schematic representation of a part of the optical imaging arrangement of FIG. 1.
Figure 3:
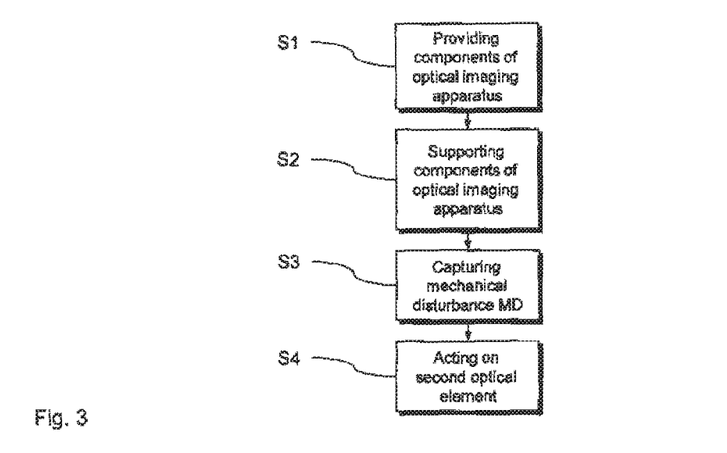
FIG. 3 is a block diagram of a preferred embodiment of an optical imaging method according to the disclosure including a preferred embodiment of a method of correcting an imaging error of an optical imaging arrangement according to the disclosure which may be executed with the optical imaging arrangement of FIG. 1.

As can be seen from FIG. 2, with certain embodiments, the sensor unit 110.2 is not connected directly to the optical element 106.6, but is mechanically connected to a support structure component 112 of the support structure system in a vicinity of the first optical element 106.6. Again, the appropriate sensor location SL2 may vary as a function of the mechanical disturbance MD of interest to be captured as well as the transmission function TF for the mechanical disturbance MD between the sensor location SL2 and the first optical element 106.6 (M6). Provided that this transmission function TF is sufficiently well known along the disturbance path (i.e. the path the mechanical disturbance MD takes from the sensor location SL2 to the relevant part of the first optical element 106.6, typically to the optical surface of the first optical element 106.6), even longer sensor location distances SLD (along the disturbance path) between the sensor location SL2 and the first optical element 106.6 may be acceptable.

It will be appreciated that, particularly in such cases allowing precise and timely reaction to an incoming mechanical disturbance MD, the control device 109 may control the actuation of the second optical element 106.2 in a proactive manner.

To this end, for example, the control unit 109.1 may use the captured disturbance information MDI to generate a forecast of the reaction of the first optical element 106.6 resulting from this mechanical disturbance MD once it arrives at the first optical element 106.6. The forecast can then be used to initiate appropriate counteractions to the result of the mechanical disturbance MD (i.e. the optical imaging error IEMD or the alteration in the optical imaging error, respectively) at the second optical element 106.2.

In the present embodiment, the control unit 109.1 includes a memory 109.2 storing control information CCI. The control information CCI is representative of at least one control signal CCS to be provided to the active device as a function of the mechanical disturbance information MDI to at (least partially) correct the optical imaging error IEMD resulting from the mechanical disturbance MD. The control unit 109.1, to at least partially correct the optical imaging error IEMD, then generates the corresponding correcting control signal CCS using the mechanical disturbance information MDI and the control information CCI. The correcting control signal CCS is then forwarded to the active device 113, i.e. the active support device 108.2 of the second optical element 106.2 to provide the corresponding correcting action at the second optical element 106.2.

The control information CCI may have been obtained, for example, using appropriate simulation of the relevant parts of the optical imaging apparatus 101. In addition or as an alternative, the control information CCI may have been previously obtained using empirical methods (e.g. from testing the relevant parts of the optical imaging apparatus 101 itself or from testing the relevant parts of a comparable optical imaging apparatus). With certain embodiments relying on simulation results, the control information CCI may include a previously established mechanical numerical model MNM and a previously established optical model OM. The mechanical numerical model MNM is a numerical model of a modeled part of the optical imaging apparatus 101 including first optical element 106.6, a capturing location, namely the sensor location SL (e.g. SL1 and/or SL2), at which the mechanical disturbance information MDI is captured, and the disturbance path DP along which the mechanical disturbance MD propagates from the sensor location SL (e.g. SL1 and/or SL2) to the first optical element 106.6.

The mechanical numerical model MNM is representative of a geometric alteration GA in a position and/or an orientation and/or a geometry of the first optical element 106.6 in response to the mechanical disturbance MD prevailing at the capturing or sensor location SL (e.g. SL1 and/or SL2). In other words, inputting a defined mechanical disturbance MD into the mechanical numerical model MNM yields a defined output describing the geometric alteration GA of the first optical element 106.6 in response to this defined mechanical disturbance MD. Hence, ultimately, the mechanical numerical model MNM may be used to predict an actual geometric alteration GA of the first optical element 106.6 in response to an actual mechanical disturbance MD.

The optical model OM is representative of an imaging error alteration IEA of the imaging error IE of the optical imaging apparatus 101 as a function of the geometric alteration GA of the first optical element 106.6. In other words, inputting a defined geometric alteration GA into the optical model OM yields a defined output describing the imaging error alteration IEA of the optical imaging apparatus 101 in response to this defined geometric alteration GA. Hence, ultimately, the optical model OM may be used to predict the actual imaging error alteration IEA of the optical imaging apparatus 101 in response to an actual geometric alteration GA.

Hence, using the mechanical numerical model MNM and, subsequently, the optical model OM, the control unit 109.1 is able to determine the imaging error alteration IEA resulting from a given mechanical disturbance MD at the sensor location SL.

The control unit 109.1 then generates the correcting control signal CCS as a function of the imaging error alteration IEA. To this end, the control device uses previously established correcting control signal information CCSI (e.g. a correcting control signal model CCSM) stored in the memory 109.2 and also forming part of the correcting control information CCI. The correcting control signal information CCSI is representative of the correcting control signal CCS involved as a function of the imaging error alteration IEA.

In other words, inputting a defined imaging error alteration IEA into the correcting control signal model CCSM yields a defined output describing the correcting control signal CCS to be provided to the active device 113 for the second optical element 106.2 to correct the imaging error alteration IEA. Hence, ultimately, the correcting control signal model CCSM may be used to generate the appropriate correcting control signal CCS for compensating the actual imaging error alteration IEA of the optical imaging apparatus 101 in response to an actual mechanical disturbance MD.

It will be appreciated that the control unit 101.1 may also use a combined model CM or combined model information CMI, respectively, including a suitable numerical combination of the mechanical numerical model MNM, the optical model OM and, eventually also, the correcting control signal model CCSM. Hence, eventually, the combined model information CMI immediately yields the correcting control signal CCS as a function of the mechanical disturbance information MDI input.

It will be appreciated that the correcting control information CCI may have been established in any desirable suitable way including numerical simulation components and/or empirical components. For example, the control information may have been established using a simulation component in the form of numerical model of a modeled part and/or optical property of the optical imaging arrangement. Hence, as outlined above, either of the mechanical numerical model MNM, the optical model OM and the correcting control signal model CCSM can be such a numerical model.

In addition or as alternative, the control information CCI may have been established using an empirical component in the form of relation between the respective input and output of obtained (and a suitable resolution) by an empirical method (e.g. appropriate testing etc.). For example either of the mechanical numerical model MNM, the optical model OM and the correcting control signal model CCSM may also be replaced by such empirically obtained relations.

For example, imaging error alteration information IEAI representative of an alteration of the imaging error IEA in response to a defined mechanical excitation ME (i.e. of defined amplitude and frequency behavior) of the first optical element 106.6 may be used as such an empirically obtained relation and/or as part of the optical model OM.

Hence, with certain embodiments, the defined mechanical excitation ME used to determine the imaging error alteration information IEAI may be generated (under the control of the control unit 109.1) using an actuator device of the support structure system 111, 112 of the optical imaging apparatus 101. More precisely, for example, the active support device 108.6 supporting the first optical element 106.6 may be used to generate this defined mechanical excitation ME under the control of the control unit 109.1.

Such data collection may take place in the assembled state of the optical imaging apparatus 101 using appropriate sensors (e.g. an online wavefront aberration sensor) within the light path allowing determination of the imaging error alteration IEA in response to the mechanical excitation. In addition or as an alternative, the data collection may take place in a preassembled state of the optical module including the first optical element 106.6 and its support device 108.6.

In addition or as alternative, an actuator device 115 supporting part of the support structure system may be used to generate the mechanical excitation ME. For example, an actuator device 115 actively supporting the intermediate support structure 112 on the base support structure 111 may be used to generate the mechanical excitation ME on that the control of the control unit 109.1. To determine the resulting imaging error alteration information IEAI, the substrate table 104.2 with the substrate 104.1 is then preferably replaced with a suitable optical sensor 114 (e.g. an online wavefront aberration sensor) capturing suitable sensor information. Hence, ultimately, the data collection may take place in the assembled state of the optical imaging apparatus 101.

In will be appreciated that, with certain embodiments, the data collection setup preferably includes the respective sensor unit 110.1, 110.2 later used to determine the mechanical disturbance information MDI. With this approach, a particularly reliable and close match between the mechanical disturbance information MDI and the imaging error alteration IEA may be obtained.

As noted above, the defined mechanical excitation ME may be of any desired and suitable type (e.g. in terms of amplitude and frequency behavior). In the present example, the defined mechanical excitation may be a sinusoidal excitation. Since, as mentioned, for the large and heavy first optical element 106.6, residual deformation resulting from low-frequency vibration plays an increasingly important role. Hence, in the present example, the vibration behavior of the first optical element 106.6 under such low frequency mechanical excitation is of particular interest. Hence, preferably, the applied defined mechanical excitation ME has an excitation frequency EF of 0.05 Hz to 1000 Hz, preferably 0.1 Hz to 100 Hz, more preferably 1 Hz to 5 Hz; With certain preferred embodiments, the first optical element 106.6 has a first order bending resonant frequency BRF1 and the excitation frequency EF ranges from 0.05 Hz to two thirds of the first order bending resonant frequency (i.e. $\frac{2}{3}$ ·BRF1).

It shall be noted here again that all the information as outlined above used in the context of generating the appropriate correction control signal CCS may be captured and/or related to one or more degrees of freedom of particular interest in the optical imaging process. Hence, eventually, all the information as outlined above may be separately taken and/or used in relation to at least one degree of freedom up to all six degrees of freedom in space.

With the optical imaging apparatus 101 of FIGS. 1 and 2 a method of transferring an image of a pattern onto a substrate may be executed using a preferred embodiment of a method of correcting an optical imaging error according to the disclosure as it will be described in the following with reference to FIGS. 1 to 3.

To this end, the components of the optical imaging apparatus 101 as they have been described above are provided in a step S1. Furthermore, in a step S2, these components, in particular, the optical elements 106.1 to 106.6 are supported via the support structure as it has been described above.

In a transferring step TS of this method, an image of the pattern formed on the mask 103.1 is transferred onto the substrate 104.1 using the optical projection unit 102 of the optical imaging arrangement 101 as it has been described above. In order to achieve the maximum possible imaging accuracy with this exposure process, the imaging error is kept as low as possible using a preferred embodiment of a method of correcting an optical imaging error according to the disclosure.

To this end, in a capturing step S3 of the transferring step, the mechanical disturbance MD propagating towards the first optical element 106.6 is captured using the control device 109 as it has been described above. In a subsequent controlling step S4 of the transferring step, the control device 109 determines the appropriate correcting control signal CCS and forwards the latter to the active device 113 to obtain appropriate correcting action at the second optical element 106.2 as it has been outlined above.

Although, in the foregoing, embodiments of the disclosure have been described where the optical elements are exclusively reflective elements, it will be appreciated that, with other embodiments of the disclosure, reflective, refractive or diffractive elements or any combinations thereof may be used for the optical elements of the optical element units. Furthermore, it will be appreciated that the present disclosure, although mainly described in the context of microlithography in the foregoing, may also be used in the context of any other type of optical imaging process, typically involving a comparably high level of imaging accuracy. In particular, the disclosure may be used in the context of any other type of optical imaging process operating at different wavelengths.

What is claimed is:

1. An optical imaging arrangement, comprising:
   an optical projection system;
   a support structure system; and
   a control device,
   wherein:
      the optical projection system comprises a group of optical elements supported by the support structure system;
      the group of optical elements is configured to transfer, in an exposure process using exposure light along an exposure light path, an image of a pattern of a mask onto a substrate;
      the group of optical elements comprises first and second optical elements;
      the control device comprises a sensor device and an active device;
      the sensor device comprises a sensor unit configured to capture mechanical disturbance information representative of a mechanical disturbance acting on the first optical element in at least one degree of freedom;

the control device is configured to control the active device based on the mechanical disturbance information and a stored numerical model so that the active device acts on at least the second optical element to at least partially correct an optical imaging error of the optical imaging arrangement during the exposure process resulting from the mechanical disturbance acting on the first optical element;

the stored numerical model is representative of an imaging error alteration of the imaging error in response to the mechanical disturbance captured by the sensor device;

the sensor unit is mechanically connected to an optical imaging arrangement component of the optical imaging arrangement at a sensor location;

a disturbance path exists, along which the mechanical disturbance propagates fastest towards the first optical element;

the sensor location is on the disturbance path;

the mechanical disturbance, along the disturbance path, has a disturbance runtime from the sensor location to the first optical element;

the control device has a control reaction time from capturing the mechanical disturbance information to acting on at least the second optical element to at least partially correct the imaging error;

the sensor location is located, along the disturbance path, at a sensor location distance from the first optical element; and the sensor location distance is selected such that the control reaction time is smaller than or equal to the disturbance runtime, and wherein at least one of the following holds:

the active device comprises an active support unit of the support structure system, the active support unit supports the second optical element, and the active support unit is configured to adjust a deformation of the second optical element in at least one degree of freedom; and the active device comprises an active deformation device assigned to the second optical element, and the active deformation device is configured to adjust a deformation of the second optical element in at least one degree of freedom.

2. The optical imaging arrangement of claim 1, wherein at least one of the following holds:

the sensor unit is mechanically connected to an optical element unit comprising the first optical element; and the sensor unit is configured to capture acceleration information in at least one degree of freedom as the mechanical disturbance information.

3. The optical imaging arrangement according of claim 1, wherein:

the control device comprises a memory configured to store control information representative of a control signal to be provided to the active device based on the mechanical disturbance information to at least partially correct the optical imaging error resulting from the mechanical disturbance; and to at least partially correct the optical imaging error, a control unit of the control device is configured to generate at least one correcting control signal using the mechanical disturbance information and the control information and to forward the correcting control signal to the active device.

4. The optical imaging arrangement of claim 3, wherein:

the control information comprises the stored numerical model;

the stored numerical model comprises a previously established mechanical numerical model and a previously established optical model;

the mechanical numerical model comprises a numerical model of a modeled part of the optical imaging arrangement;

the modeled part comprises the first optical element, a capturing location at which the mechanical disturbance information is captured, and the disturbance path;

the mechanical numerical model is representative of a geometric alteration in a position and/or an orientation and/or a geometry of the first optical element in response to the mechanical disturbance at the capturing location;

the optical model is representative of an imaging error alteration of the imaging error based on the geometric alteration;

the control device is configured to generate the correcting control signal based on the imaging error alteration;

the control device is configured to use previously established correcting control signal information stored in the memory and representative of the correcting control signal based on the imaging error alteration; and to generate the correcting control signal, the control device is configured to: a) predict an actual geometric alteration of the first optical element in response to an actual mechanical disturbance captured at the capturing location using the mechanical numerical model; b) predict an actual imaging error alteration of the imaging error based on the predicted actual geometric alteration using the optical model; and c) generate an actual correcting control signal based on the predicted actual imaging error alteration using the correcting control signal information.

5. The optical imaging arrangement of claim 3, wherein at least one of the following holds:

the mechanical numerical model comprises a modeled part of the optical imaging arrangement, the modeled part comprises the first optical element, a capturing location at which the mechanical disturbance information is captured, and the disturbance path, and the mechanical numerical model is representative of a geometric alteration in a position and/or an orientation and/or a geometry of the first optical element in response to the mechanical disturbance at the capturing location;

the optical model is representative of an imaging error alteration of the imaging error as based on a geometric alteration of the first optical element in response to the mechanical disturbance;

the control information has been established using imaging error alteration information representative of an alteration of the imaging error in response to a defined mechanical excitation of the first optical element, the defined mechanical excitation has been generated using at least one actuator device of the support structure system, the defined mechanical excitation is a sinusoidal excitation and/or having an excitation frequency of 0.05 Hz to 1000 Hz, and the first optical element has a first order bending resonant frequency and the excitation frequency, in particular ranging from 0.05 Hz to two thirds of the first order bending resonant frequency; and the control information has been established using correcting control signal information representative of the correcting control signal base on an imaging error alteration.

6. The optical imaging arrangement of claim 1, wherein:
the support structure system comprises a base support structure and an intermediate support structure;
the first optical element is supported on the intermediate support structure;
the intermediate support structure is supported on the base structure via a vibration isolation device; and
the vibration isolation device has a vibration isolation resonant frequency in a range from 10 Hz to 1 Hz.

7. The optical imaging arrangement of claim 1, wherein at least one of the following holds:
the optical imaging arrangement is configured to be used in microlithography using exposure light at an exposure light wavelength in an EUV range;
the exposure light has an exposure light wavelength ranging from 5 nm to 20 nm;
the optical elements of the group of optical elements comprise reflective optical elements;
the first optical element is the largest and/or heaviest among the optical elements of the group of optical elements; and
an illumination unit, a mask unit and a substrate unit are provided, the illumination unit is configured to illuminate the mask received within the mask unit with the exposure light, and the substrate unit is configured to receive the substrate to receive the image transferred by the optical projection system.

8. The optical imaging arrangement according of claim 1, wherein:
the control device comprises a memory configured to store control information representative of a control signal to be provided to the active device based on the mechanical disturbance information to at least partially correct the optical imaging error resulting from the mechanical disturbance; and
to at least partially correct the optical imaging error, a control unit of the control device is configured to generate at least one correcting control signal using the mechanical disturbance information and the control information and to forward the correcting control signal to the active device.

9. The optical imaging arrangement of claim 8, wherein:
the control information comprises the stored numerical model;
the stored numerical model comprises a previously established mechanical numerical model and a previously established optical model;
the mechanical numerical model comprises a numerical model of a modeled part of the optical imaging arrangement;
the modeled part comprises the first optical element, a capturing location at which the mechanical disturbance information is captured, and the disturbance path;
the mechanical numerical model is representative of a geometric alteration in a position and/or an orientation and/or a geometry of the first optical element in response to the mechanical disturbance at the capturing location;
the optical model is representative of an imaging error alteration of the imaging error based on the geometric alteration;
the control device is configured to generate the correcting control signal based on the imaging error alteration;
the control device is configured to use previously established correcting control signal information stored in the memory and representative of the correcting control signal based on the imaging error alteration; and
to generate the correcting control signal, the control device is configured to: a) predict an actual geometric alteration of the first optical element in response to an actual mechanical disturbance captured at the capturing location using the mechanical numerical model; b) predict an actual imaging error alteration of the imaging error based on the predicted actual geometric alteration using the optical model; and c) generate an actual correcting control signal based on the predicted actual imaging error alteration using the correcting control signal information.

10. The optical imaging arrangement of claim 1, wherein the optical imaging error of the optical imaging arrangement is caused by a deformation of the first optical element resulting from the mechanical disturbance acting on the first optical element.

11. A method of using and optical imaging arrangement comprising an optical projection system, a support structure system, and a control device, the optical projection system comprising a group of optical elements including a first optical element and a second optical element supported by the support structure system and transferring, in the exposure process using exposure light along an exposure light path, an image of a pattern of a mask onto a substrate, the control device comprising sensor device and an active device, the sensor device comprising a sensor unit the method comprising:
using a sensor device to capture mechanical disturbance information representative of a mechanical disturbance acting on the first optical element in at least one degree of freedom;
using the control device to control the active device based on the mechanical disturbance information and a stored mechanical model so that the active device acts on at least the second optical element to at least partially correct the optical imaging error resulting from the mechanical disturbance acting on the first optical element,
wherein:
the stored numerical model is representative of an imaging error alteration of the imaging error in response to the mechanical disturbance captured by the sensor device
the sensor unit is mechanically connected to an optical imaging arrangement component of the optical imaging arrangement at a sensor location;
a disturbance path exists, along which the mechanical disturbance propagates fastest towards the first optical element;
the sensor location is on the disturbance path;
the mechanical disturbance, along the disturbance path, has a disturbance runtime from the sensor location to the first optical element;
the control device has a control reaction time from capturing the mechanical disturbance information to acting on at least the second optical element to at least partially correct the imaging error;

the sensor location is located, along the disturbance path, at a sensor location distance from the first optical element; and the sensor location distance is selected such that the control reaction time is smaller than or equal to the disturbance runtime, wherein at least one of the following holds:

the active device comprises an active support unit of the support structure system, the active support unit supports the second optical element, and the active support unit is configured to adjust a deformation of the second optical element in at least one degree of freedom; and the active device comprises an active deformation device assigned to the second optical element, and the active deformation device is configured to adjust a deformation of the second optical element in at least one degree of freedom.

12. The method of claim 11, wherein at least one of the following holds:

the sensor unit is mechanically connected to an optical element unit comprising the first optical element; and the sensor unit captures acceleration information in at least one degree of freedom up to all six degrees of freedom as the mechanical disturbance information.

13. The method according of claim 11, wherein:

control information representative of at least one control signal to be provided to the active device based on the mechanical disturbance information to at least partially correct the optical imaging error resulting from the mechanical disturbance is retrieved from a memory; and to at least partially correct the optical imaging error, a control unit of the control device generates at least one correcting control signal using the mechanical disturbance information and the control information and forwards the correcting control signal to the active device.

14. The method of claim 13, wherein:

the control information comprises the stored numerical model;

the stored numerical model comprises a previously established mechanical numerical model and a previously established optical model;

the mechanical numerical model is a numerical model of a modeled part of the optical imaging arrangement, the modeled part comprising at least the first optical element, a capturing location at which the mechanical disturbance information is captured, and the disturbance path;

the mechanical numerical model is representative of a geometric alteration in a position and/or an orientation and/or a geometry of the first optical element in response to the mechanical disturbance at the capturing location;

the optical model is representative of an imaging error alteration of the imaging error based on the geometric alteration;

the control device generates the correcting control signal based on the imaging error alteration, wherein the control device, in particular, uses previously established correcting control signal information stored in the memory and representative of the correcting control signal based on the imaging error alteration; and the control device: a) predicts an actual geometric alteration of the first optical element in response to an actual mechanical disturbance captured at the capturing location using the mechanical numerical model; b) predicts an actual imaging error alteration of the imaging error based on the predicted actual geometric alteration using the optical model; and c) generates an actual correcting control signal based on the predicted actual imaging error alteration using the correcting control signal information.

15. The method of claim 13, wherein at least one of the following holds:

the stored numerical model comprises a modeled part of the optical imaging arrangement, the modeled part comprises at least the first optical element, a capturing location at which the mechanical disturbance information is captured, and the disturbance path, and the mechanical numerical model is representative of a geometric alteration in a position and/or an orientation and/or a geometry of the first optical element in response to the mechanical disturbance at the capturing location;

the optical model representative of an imaging error alteration of the imaging error based on a geometric alteration of the first optical element in response to the mechanical disturbance;

the control information is established using imaging error alteration information representative of an alteration of the imaging error in response to a defined mechanical excitation of the first optical element, the defined mechanical excitation is generated using at least one actuator device of the support structure system the defined mechanical excitation is a sinusoidal excitation and/or having an excitation frequency of 0.05 Hz to 1000 Hz, and the first optical element has a first order bending resonant frequency and the excitation frequency ranging from 0.05 Hz to two thirds of the first order bending resonant frequency; and the control information is established using correcting control signal information representative of the correcting control signal based on an imaging error alteration of the imaging error.

16. The method according of claim 11, wherein the first optical element is supported on an intermediate support structure, and the intermediate support structure is supported on a base structure via a vibration isolation device having a vibration isolation resonant frequency in a range from 10 Hz to 1 Hz.

17. The method according of claim 11, wherein at least one of the following holds:

the optical imaging arrangement is used in microlithography using exposure light at an exposure light wavelength in an EUV range;

the exposure light has an exposure light wavelength ranging from 5 nm to 20 nm;

the optical elements of the group of optical elements comprise reflective optical elements; and an illumination unit, a mask unit and a substrate unit are provided, the illumination unit illuminating the mask are received within the mask unit with the exposure light and the substrate unit receiving the substrate to receive the image transferred by the optical projection system.

18. The method of claim 11, further comprising:

transferring, in an exposure process using exposure light in an optical imaging arrangement, an image of a pattern onto a substrate, wherein, during the exposure process, the imaging error of the optical imaging arrangement is at least partially corrected.

19. An optical imaging arrangement, comprising:
an optical projection system;
a support structure system; and
a control device,
wherein:
  the optical projection system comprises a group of optical elements supported by the support structure system;
  the group of optical elements is configured to transfer, in an exposure process using exposure light along an exposure light path, an image of a pattern of a mask onto a substrate;
  the group of optical elements comprises first and second optical elements;
  the control device comprises a sensor device and an active device;
  the sensor device comprises a sensor unit configured to capture mechanical disturbance information representative of a mechanical disturbance acting on the first optical element in at least one degree of freedom;
  the control device is configured to control the active device based on the mechanical disturbance information and a stored numerical model so that the active device acts on at least the second optical element to at least partially correct an optical imaging error of the optical imaging arrangement during the exposure process resulting from the mechanical disturbance acting on the first optical element;
  the stored numerical model is representative of an imaging error alteration of the imaging error in response to the mechanical disturbance captured by the sensor device;
  the sensor unit is mechanically connected to an optical imaging arrangement component of the optical imaging arrangement at a sensor location;
  a disturbance path exists, along which the mechanical disturbance propagates fastest towards the first optical element;
  the sensor location is on the disturbance path;
  the mechanical disturbance, along the disturbance path, has a disturbance runtime from the sensor location to the first optical element;
  the control device has a control reaction time from capturing the mechanical disturbance information to acting on at least the second optical element to at least partially correct the imaging error;
  the sensor location is located, along the disturbance path, at a sensor location distance from the optical element; and
  the sensor location distance is selected such that the control reaction time is smaller than or equal to the disturbance runtime,
wherein at least one of the following holds:
  the active device comprises an active support unit of the support structure system, the active support unit supports the second optical element, and the active support unit is configured to adjust in at least one degree of freedom at least one member selected from the group consisting of a position of the second optical element, an orientation of the second optical element, and a deformation of the second optical element; and the active device comprises an active deformation device assigned to the second optical element, and the active deformation device is configured to adjust in at least one degree of freedom at least one parameter selected from the group consisting of a position of the second optical element, an orientation of the second optical element and a deformation of the second optical element.

20. The optical imaging arrangement according of claim 19, wherein:
  the control device comprises a memory configured to store control information representative of a control signal to be provided to the active device based on the mechanical disturbance information to at least partially correct the optical imaging error resulting from the mechanical disturbance; and
  to at least partially correct the optical imaging error, a control unit of the control device is configured to generate at least one correcting control signal using the mechanical disturbance information and the control information and to forward the correcting control signal to the active device.

21. The optical imaging arrangement of claim 20, wherein:
  the control information comprises the stored numerical model;
  the stored numerical model comprises a previously established mechanical numerical model and a previously established optical model;
  the mechanical numerical model comprises a numerical model of a modeled part of the optical imaging arrangement;
  the modeled part comprises the first optical element, a capturing location at which the mechanical disturbance information is captured, and the disturbance path;
  the mechanical numerical model is representative of a geometric alteration in a position and/or an orientation and/or a geometry of the first optical element in response to the mechanical disturbance at the capturing location;
  the optical model is representative of an imaging error alteration of the imaging error based on the geometric alteration;
  the control device is configured to generate the correcting control signal based on the imaging error alteration;
  the control device is configured to use previously established correcting control signal information stored in the memory and representative of the correcting control signal based on the imaging error alteration; and
  to generate the correcting control signal, the control device is configured to: a) predict an actual geometric alteration of the first optical element in response to an actual mechanical disturbance captured at the capturing location using the mechanical numerical model; b) predict an actual imaging error alteration of the imaging error based on the predicted actual geometric alteration using the optical model; and c) generate an actual correcting control signal based on the predicted actual imaging error alteration using the correcting control signal information.

* * * * *

UNITED STATES PATENT AND TRADEMARK OFFICE
CERTIFICATE OF CORRECTION

PATENT NO. : 10,890,850 B2
APPLICATION NO. : 15/988113
DATED : January 12, 2021
INVENTOR(S) : Stefan Hembacher, Bernhard Geuppert and Jens Kugler Page 1 of 1

It is certified that error appears in the above-identified patent and that said Letters Patent is hereby corrected as shown below:

In the Specification

Column 1, Line 9, after "application" insert -- No. --;

Column 1, Line 63, delete "rPesults." and insert -- results. --;

Column 6, Lines 21-22, delete "an using" and insert -- using an --;

Column 9, Line 7, delete "Hz;" and insert -- Hz. --;

Column 9, Line 36, after "beneficially" delete "be";

Column 9, Line 46, delete "Hz;" and insert -- Hz. --;

Column 16, Line 56, delete "CRT≤DRT" and insert -- CRT≤DRT. --;

In the Claims

Column 21, Line 57, Claim 3, delete "of" and insert -- to --;

Column 23, Line 37, Claim 8, delete "of" and insert -- to --;

Column 25, Line 26, Claim 13, delete "of" and insert -- to --;

Column 26, Line 40, Claim 16, delete "of" and insert -- to --;

Column 26, Line 46, Claim 17, delete "of" and insert -- to --;

Column 28, Line 9, Claim 20, delete "of" and insert -- to --.

Signed and Sealed this
Sixth Day of April, 2021

Drew Hirshfeld
*Performing the Functions and Duties of the*
*Under Secretary of Commerce for Intellectual Property and*
*Director of the United States Patent and Trademark Office*